United States Patent
Ho et al.

(10) Patent No.: US 11,439,007 B2
(45) Date of Patent: Sep. 6, 2022

(54) NANOTWINNED STRUCTURE

(71) Applicant: Yuan Ze University, Taoyuan (TW)

(72) Inventors: Cheng-En Ho, Taoyuan (TW);
Bau-Chin Huang, Hsinchu County (TW); Cheng-Hsien Yang, Taoyuan (TW); Cheng-Yu Lee, Taoyuan (TW)

(73) Assignee: Yuan Ze University, Taoyuan (TW)

( * ) Notice: Subject to any disclaimer, the term of this patent is extended or adjusted under 35 U.S.C. 154(b) by 448 days.

(21) Appl. No.: 16/705,138

(22) Filed: Dec. 5, 2019

(65) Prior Publication Data

US 2020/0236782 A1   Jul. 23, 2020

(30) Foreign Application Priority Data

Jan. 18, 2019 (TW) .................................. 108101986

(51) Int. Cl.
 *H05K 1/09*  (2006.01)
 *H01L 23/48*  (2006.01)
 *H05K 1/11*  (2006.01)

(52) U.S. Cl.
 CPC ............. *H05K 1/09* (2013.01); *H01L 23/481* (2013.01); *H05K 1/115* (2013.01)

(58) Field of Classification Search
 CPC .............................. H05K 1/09; H01L 23/481
 See application file for complete search history.

(56) References Cited

U.S. PATENT DOCUMENTS

| | | | |
|---|---|---|---|
| 7,736,448 B2 | 6/2010 | Lu et al. | |
| 9,476,140 B2 | 10/2016 | Chen et al. | |
| 10,094,033 B2 | 10/2018 | Chen et al. | |
| 2012/0135260 A1 | 5/2012 | Jang et al. | |
| 2013/0122326 A1* | 5/2013 | Chen | C25D 5/08 205/291 |
| 2014/0217593 A1* | 8/2014 | Chen | B23K 1/0016 257/762 |

FOREIGN PATENT DOCUMENTS

| | | |
|---|---|---|
| CN | 1292432 | 4/2001 |
| CN | 1498987 | 5/2004 |
| CN | 100503880 | 6/2009 |
| CN | 103390565 | 11/2013 |
| CN | 103730445 | 4/2014 |
| CN | 102400188 | 10/2014 |
| CN | 106298634 | 1/2017 |
| CN | 106876294 | 6/2017 |

(Continued)

OTHER PUBLICATIONS

"Office Action of China Counterpart Application", dated Oct. 9, 2021, p. 1-p. 10.

(Continued)

*Primary Examiner* — Farun Lu
(74) *Attorney, Agent, or Firm* — JCIPRNET

(57) ABSTRACT

A nanotwinned structure deposited on a surface of a substrate is provided. The nanotwinned structure includes at least one domain, and the domain includes a plurality of nanotwins. Each of the nanotwins possesses a faced-centered cubic (FCC) structure. The plurality of nanotwins are stacked along the [111] crystallographic axis. Less than 50% of a surface of the nanotwinned structure takes the (111) as the preferred orientation.

19 Claims, 5 Drawing Sheets

(56) References Cited

FOREIGN PATENT DOCUMENTS

| | | |
|---|---|---|
| KR | 101255548 | 4/2013 |
| TW | I223867 | 11/2004 |
| TW | 201315823 | 4/2013 |
| TW | 201321557 | 6/2013 |
| TW | 201542888 | 11/2015 |
| TW | I507548 | 11/2015 |
| TW | 201621091 | 6/2016 |

OTHER PUBLICATIONS

Office Action of China Counterpart Application, dated Jun. 1, 2021, pp. 1-6.

* cited by examiner

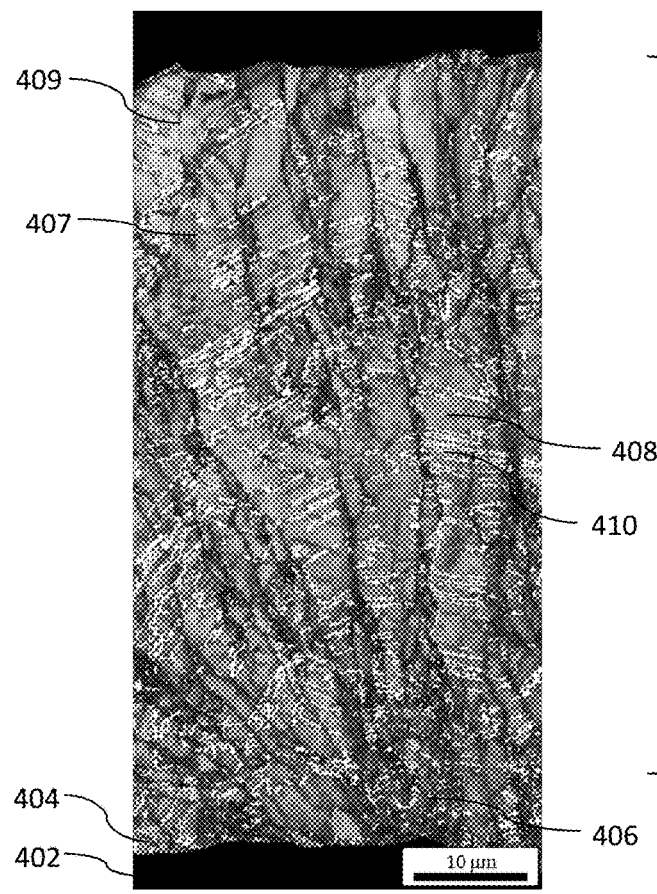
FIG.4A
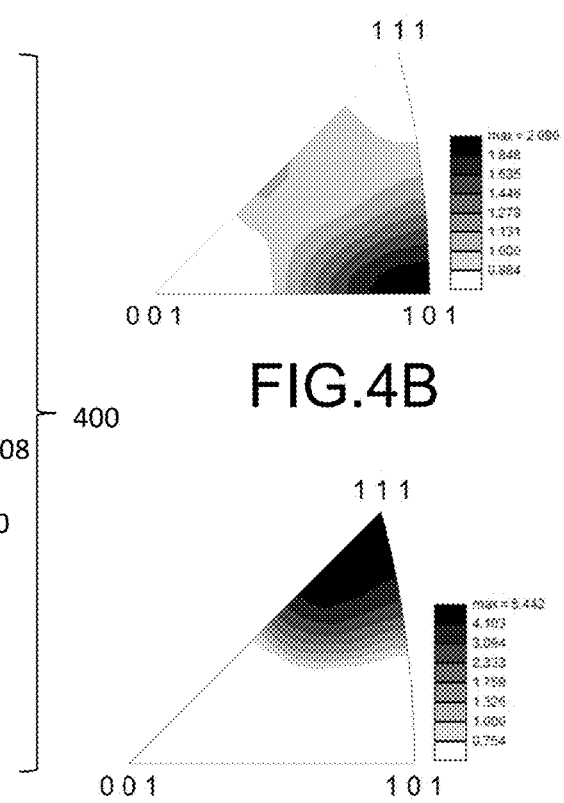
FIG.4B
FIG.4C

NANOTWINNED STRUCTURE

CROSS REFERENCE TO RELATED APPLICATION

This application claims the priority benefit of Taiwan application serial no. 108101986, filed on Jan. 18, 2019. The entirety of the above-mentioned patent application is hereby incorporated by reference herein and made a part of specification.

BACKGROUND

Technical Field

The invention relates to a nanotwinned structure.

Description of Related Art

Generally, the mechanical strength of a metal increases with a decrease of its grain size. Particularly, when the grain size is reduced to a nanometer scale, the metal may have mechanical characteristics of high hardness, low Young's modulus, etc. Nanotwinned Cu is a currently developed nano-scale twinned structure material, which possesses the material characteristics of high mechanical strength (for example, tensile strength and hardness), anti-electromigration, anti-thermal fatigue, anti-corrosion, acceptable conductivity, good heat dissipation, good thermal stability, etc. Therefore, the nanotwinned Cu is now been evaluated to apply in the fields of plating through hole (PTH), through-hole (TH)/blind-hole (BH) fillings, through silicon via (TSV) fillings, interconnect structure, etc.

However, fabrication of the nanotwinned Cu through electroplating generally requires a pulse electroplating method, and such fabrication process is more expensive than the traditional direct current (DC) electroplating method, and the electroplating efficiency thereof is relatively poor. Moreover, the pulse electroplating method may only yield nanotwins with an irregular structure. In the conventional technique, a DC electroplating method for the fabrication of nanotwinned Cu requires the rotation of cathode and a seed layer on the substrate, and only the nanotwinned structures with a highly (111) preferred orientation may be manufactured. Based on the above restrictions, the deposition of the nanotwinned Cu and comprehensively implementation in the electronic industry are difficult at the present state.

SUMMARY

The invention is directed to a nanotwinned structure, where less than 50% of the surface of the nanotwinned structure takes the (111) plane as the preferredorientation.

The invention provides a nanotwinned structure deposited on a surface of a substrate, and including at least one domain, where the domain contains a plurality of nanotwins. Each of the nanotwins possesses a face-centered cubic (FCC) structure, and the plurality of nanotwins are stacked along a [111] crystallographic axis, and less than 50% of a surface of the nanotwinned structure takes the (111) plane as the preferred orientation.

In an embodiment of the invention, the nanotwinned structure includes a plurality of the domains, and the [111] crystallographic axes of the adjacent domains are substantially parallel with each other.

In an embodiment of the invention, the nanotwinned structure includes a plurality of the domains, and the [111] crystallographic axes of the adjacent domains are not parallel with each other.

In an embodiment of the invention, a material of the nanotwinned structure is, for example, gold, palladium, silver, platinum, copper, iron, indium, nickel, lead or a combination thereof.

In an embodiment of the invention, a material of the nanotwinned structure further includes zinc, tungsten, cobalt, phosphorus, titanium, bismuth, tin or a combination thereof.

In an embodiment of the invention, a shape of the domain is, for example, a polygon, a column, an ellipse or a combination thereof.

In an embodiment of the invention, the nanotwinned structure is, for example, disposed on the substrate.

In an embodiment of the invention, the substrate is, for example, a conductive substrate.

In an embodiment of the invention, the conductive substrate is, for example, a metal substrate or a graphite (graphene) substrate.

In an embodiment of the invention, the substrate is, for example, an insulation substrate, and a conductive layer is disposed between the nanotwinned structure and the insulation substrate.

In an embodiment of the invention, the insulation substrate is, for example, a printed circuit board, a silicon substrate, a compound semiconductor substrate, a glass substrate, a quartz substrate, a plastic substrate or a combination thereof.

In an embodiment of the invention, the nanotwinned structure is, for example, disposed in a hole of the substrate, and a conductive layer is disposed between the nanotwinned structure and a sidewall of the hole.

In an embodiment of the invention, the hole is, for example, a through hole or a blind hole.

In an embodiment of the invention, the nanotwinned structure further includes a transition layer disposed between the nanotwinned structure and the conductive layer, where the transition layer includes disperse grains or a combination of the nanotwins and the disperse grains.

In an embodiment of the invention, a thickness of the transition layer is, for example, less than 500 μm.

In an embodiment of the invention, a material of the conductive layer is, for example, carbon, gold, palladium, silver, platinum, copper, iron, cobalt, nickel, phosphorus, titanium, tungsten, tin, lead, bismuth, indium, zinc, a combination thereof or indium tin oxide (ITO).

Based on the above description, in the nanotwinned structure of the invention, less than 50% of the surface takes the (111) plane as the preferred orientation. When the nanotwinned structure of the invention is applied to plating through hole (PTH), through-hole (TH)/blind-hole (BH) fillings, through silicon via (TSV) fillings, an interconnect structure or heat dissipation devices, the components formed by the nanotwinned structure of the invention may have an electromigration resistance characteristic, a high mechanical strength and a good heat dissipation ability.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4A is an EBSD-IQ map overlapped the twin boundary distribution of the nanotwinned structure according to the fourth embodiment of the invention.

FIG. 4B is an IPF of the first domain of FIG. 4A.

FIG. 4C is an IPF of the second domain of FIG. 4A.

DESCRIPTION OF THE EMBODIMENTS

Figure 1A:
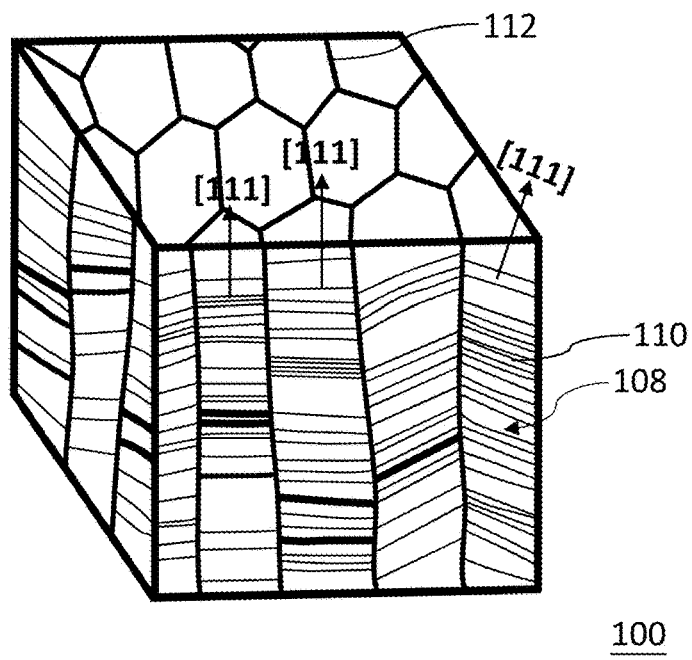
FIG. 1A is a three-dimensional view of a nanotwinned structure according to the first embodiment of the invention.

The nanotwinned structure of the embodiment of the invention may be applied to a variety of electronic devices; for example, the nanotwinned structure of the invention may be applied to form metal conductive pillars, wires, an interconnect structure, plating through hole (PTH), through-hole (TH)/blind-hole (BH) fillings, through-silicon-via (TSV) fillings, through-GaN via (TGNV) fillings, through-glass-via (TGV) fillings, redistribution layer (RDL), heat dissipation devices, etc., as the connecting materials of an electronic package. In this way, the components formed by the nanotwinned structure of the embodiment of the invention may have an electromigration resistance characteristic, a high mechanical strength and a good heat dissipation ability.

The nanotwinned structure of the embodiment may be formed in a commercial equipment through direct current (DC) electroplating, pulse electroplating, pulse-reverse electroplating, ultrasonic-enhanced electroplating, high-speed electroplating, electromagnetic-enhanced electroplating, etc. Moreover, an electroplating solution of the nanotwinned structure may be consisted of an organic acid or an inorganic acid such as sulfuric acid, methanesulfonic acid or a mixture thereof. The electroplating solution may further contain additives such as gelatin, a surfactant, a twin growth agent, etc. A plating current density used in electroplating is, for example, between 0.05 A/dm$^2$ (ASD) to 100 A/dm$^2$. The nanotwinned structure of the embodiment of the invention is described in detail below.

First Embodiment

In the embodiment, the nanotwinned structure is deposited on a surface of a substrate. The nanotwinned structure includes a plurality of domains, and each of the domains includes a plurality of nanotwins stacked along the [111] crystallographic axis, and the [111] crystallographic axes of a part of the adjacent domains might be substantially parallel with each other. Namely, in the nanotwinned structure of the embodiment, the [111] crystallographic axes of all of the adjacent domains may be substantially parallel with each other, or the [111] crystallographic axes of a part of the adjacent domains are substantially parallel with each other and the [111] crystallographic axes of other adjacent domains are not parallel with each other. Shapes of the domains may be polygons, columns, ellipses or a combination thereof. Moreover, a surface of the nanotwinned structure does not take the (111) plane as the preferred orientation. A material of the nanotwinned structure may be copper, gold, palladium, silver, platinum, iron, indium, nickel, lead or a combination thereof, and minor elements (such as zinc, tungsten, cobalt, phosphorus, titanium, bismuth, tin, etc.) may also be mixed therein. When the material of the nanotwinned structure is copper, the nanotwinned structure is generally referred to as nanotwinned Cu.

In the embodiment, the nanotwinned structure is disposed (deposited) on an insulation substrate, and a conductive layer is disposed between the nanotwinned structure and the insulation substrate. The insulation substrate is, for example, a printed circuit board (PCB, including a dielectric layer and a conductive layer disposed therein), a silicon substrate, a compound semiconductor substrate (for example, a III-V group compound semiconductor substrate), a glass substrate, a quartz substrate, a plastic substrate or a combination thereof. A material of the conductive layer is, for example, carbon, gold, palladium, silver, platinum, copper, iron, cobalt, nickel, phosphorus, titanium, tungsten, tin, lead, bismuth, indium, zinc, or a combination thereof, or the material of the conductive layer may also be other conductive material such as ITO.

Moreover, in the embodiment, a transition layer might exist between the nanotwinned structure and the conductive layer, and the transition layer includes disperse grains or both of the disperse grains and the nanotwins, though the invention is not limited thereto. In other embodiments, there may be no transition layer between the nanotwinned structure and the conductive layer. Generally, the thickness of the transition layer is less than 500 μm.

Particularly, in other embodiments, the nanotwinned structure may also be disposed on a conductive substrate and in contact with the conductive substrate, so that no conductive layer is need to be additionally disposed. The conductive substrate is, for example, a metal substrate or a graphite (graphene) substrate.

Figure 1B:
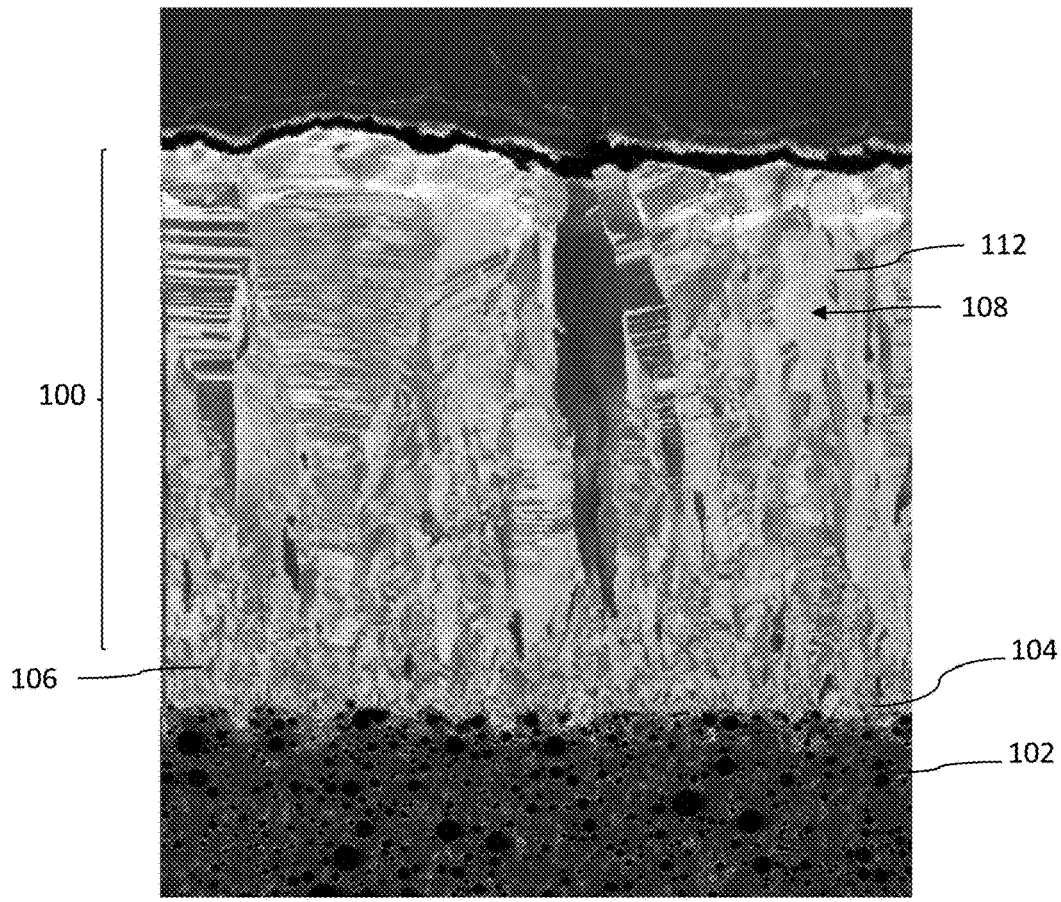
FIG. 1B is a focused ion beam (FIB) image of a nanotwinned structure according to the first embodiment of the invention.
Figure 1C:
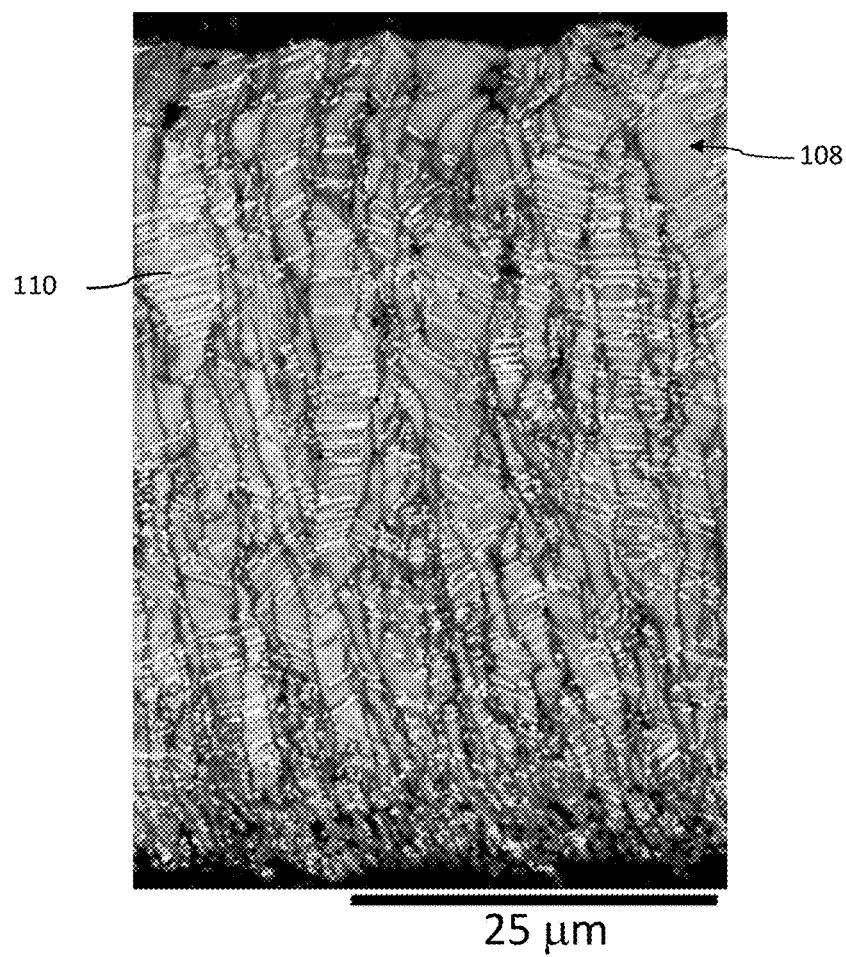
FIG. 1C is an electron backscatter diffraction (EBSD)-image quality (IQ) map overlapped the twin boundary distribution of the nanotwinned structure corresponding a portion of the domains in FIG. 1B.
Figure 1D:
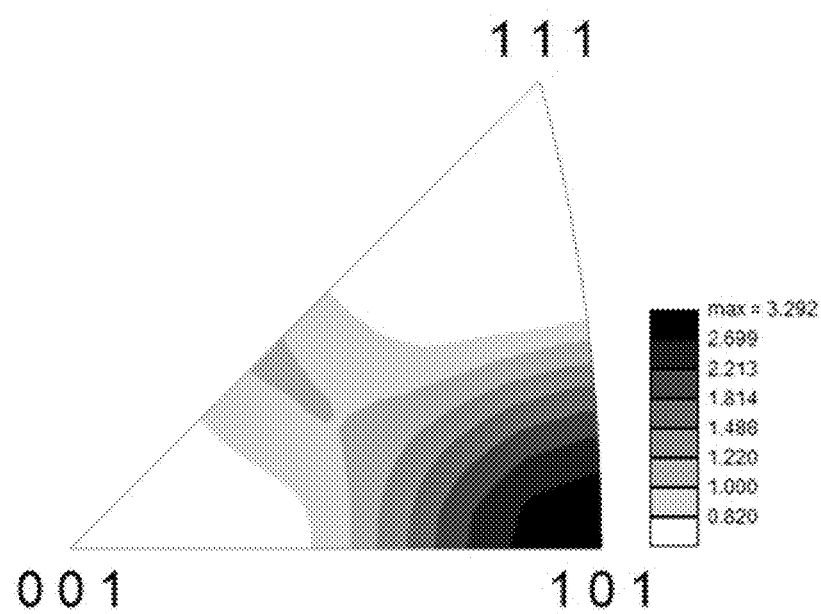
FIG. 1D is an inverse pole figure (IPF) of the domains shown in FIG. 1C.

FIG. 1A is a three-dimensional view of a nanotwinned structure according to the first embodiment of the invention. FIG. 1B is a FIB image of the nanotwinned structure according to the first embodiment of the invention. FIG. 1C is an EBSD-IQ map overlapped the twin boundary distribution of the nanotwinned structure corresponding a portion of the domains in FIG. 1B. FIG. 1D is an IPF of the domains shown in FIG. 1C.

Referring to FIG. 1A, FIG. 1B, FIG. 1C and FIG. 1D, the nanotwinned structure 100 of the embodiment is a nanotwinned Cu structure, which is disposed (deposited) on a PCB 102, and a conductive layer 104 is disposed between the nanotwinned structure 100 and the PCB 102. Moreover, the nanotwinned structure 100 and the conductive layer 104 have a transition layer 106 therebetween. In FIG. 1A, in order to clearly indicate the nanotwinned structure, the PCB 102, the conductive layer 104 and the transition layer 106 are omitted.

The nanotwinned structure 100 includes a plurality of columnar domains 108. Theses domains 108 include a plurality of nanotwinned Cu stacked along the [111] crystallographic axis. As shown in FIG. 1A and FIG. 1C, for each of the domains 108, the twin planes 110 of the nanotwinned Cu are all stacked along the [111] crystallographic axes, and the disorientation angle between the nanotwins is approximately 60° (i.e. Σ3 twin boundaries).

Moreover, in the nanotwinned structure 100, the adjacent domains 108 have grain boundaries 112 therebetween. In the domains 108 of the nanotwinned structure 100, the [111] crystallographic axes of a part of the adjacent domains 108 are parallel or substantially parallel with each other. For example, according to FIG. 1A, it is known that the [111] crystallographic axes of the two domains 108 are parallel with each other. Moreover, the nanotwinned structure 100 may also include the domains 108 with unparallel [111] crystallographic axes. For example, according to FIG. 1A, it is known that the [111] crystallographic axes of the domains 108 located at the left-hand side and the domain 108 located at the right-hand side are not parallel with each other.

Moreover, according to the IPF of FIG. 1D, it is known that a surface of the domains 108 of the nanotwinned structure 100 takes the (101) plane as the preferred orientation. In the nanotwinned structure 100, since each of the domains 108 substantially have the same structure, the entire surface of the nanotwinned structure 100 takes the (101) plane as the preferred orientation (rather than taking the (111) plane as the preferred orientation), which is different to the general nanotwinned Cu structure (more than 50% of the entire surface takes the (111) plane as the preferred orientation).

As described above, when the PCB 102 is replaced by a conductive substrate, the conductive layer 104 may be omitted, so that the nanotwinned structure 100 contacts with the conductive substrate, and the nanotwinned structure 100 and the conductive substrate do not have the transition layer 106 therebetween.

Second Embodiment

In the embodiment, the nanotwinned structure is deposited on a surface of a substrate. The nanotwinned structure includes a plurality of domains, and each of the domains includes a plurality of nanotwins stacked along the [111] crystallographic axis, and the [111] crystallographic axes of the adjacent domains are not parallel with each other. The shapes of the domains may be polygons, columns, ellipses or a combination thereof. Moreover, the surface of the nanotwinned structure does not take the (111) plane as the preferred orientation. A material of the nanotwinned structure may be gold, palladium, silver, platinum, copper, iron, indium, nickel, lead or a combination thereof, and trace elements (such as zinc, tungsten, cobalt, phosphorus, titanium, bismuth, tin, etc.) may be mixed therein.

In the embodiment, the nanotwinned structure is disposed (deposited) on a conductive substrate, and contacts with the conductive substrate, and no transition layer is disposed between the nanotwinned structure and the conductive substrate. The conductive substrate is, for example, a metal substrate or a graphite (graphene) substrate.

In other embodiments, the nanotwinned structure may also be disposed (deposited on an insulation substrate, and a conductive layer is disposed between the nanotwinned structure and the insulation substrate. The insulation substrate is, for example, a PCB (including a dielectric layer and a circuit layer disposed therein), a silicon substrate, a compound semiconductor substrate (for example, a III-V group compound semiconductor substrate), a glass substrate, a quartz substrate, a plastic substrate or a combination thereof. A material of the conductive layer is, for example, carbon, gold, palladium, silver, platinum, copper, iron, cobalt, nickel, phosphorus, titanium, tungsten, tin, lead, bismuth, indium, zinc, or a combination thereof, or the material of the conductive layer may also be other conductive material such as ITO.

Figure 2A:
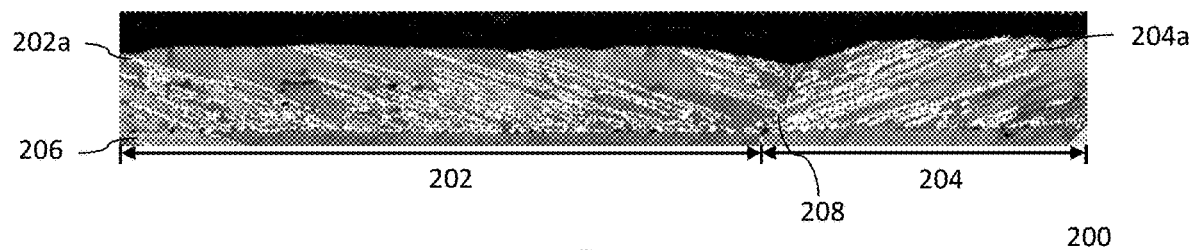
FIG. 2A is an EBSD-IQ map overlapped the twin boundary distribution of the nanotwinned structure according to the second embodiment of the invention.
Figure 2B:
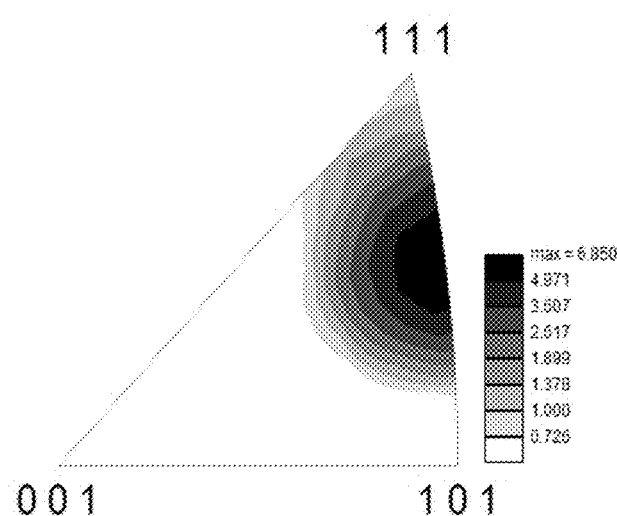
FIG. 2B is an IPF of the first domain of FIG. 2A.
Figure 2C:
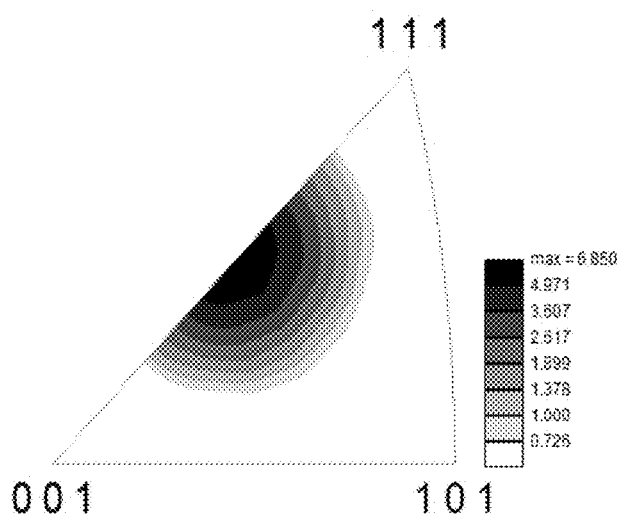
FIG. 2C is an IPF of the second domain of FIG. 2A.

FIG. 2A is an EBSD-IQ map overlapped the twin boundary distribution of the nanotwinned structure according to the second embodiment of the invention. FIG. 2B is an IPF of the first domain of FIG. 2A. FIG. 2C is an IPF of the second domain of FIG. 2A.

Referring to FIG. 2A, FIG. 2B and FIG. 2C, the nanotwinned structure 200 of the embodiment is a nanotwinned Cu structure, which is disposed (deposited) on a metal substrate 206 and contacts with the metal substrate 206.

The nanotwinned structure 200 includes two columnar domains (for example, the first domain 202 and the second domain 204). The first domain 202 and the second domain 204 have a grain boundary 208 therebetween. The first domain 202 and the second domain 204 both include a plurality of nanotwinned Cu stacked along the [111] crystallographic axis. In the first domain 202, twin planes 202a of the nanotwinned Cu are stacked along the [111] crystallographic axis, i.e. the nanotwinned Cu are stacked along the [111] crystallographic axis. In the second domain 204, twin planes 204a of the nanotwinned Cu are stacked along the [111] crystallographic axis, i.e. the nanotwinned Cu are stacked along the [111] crystallographic axis. Moreover, as shown in FIG. 2A, the [111] crystallographic axis of the first domain 202 and the crystallographic axis of the second domain 204 are not parallel with each other.

According to the IPF of the first domain 202 of FIG. 2B and the IPF of the second domain 204 of FIG. 2C, it is known that the entire surface of the first domain 202 and the entire surface of the second domain 204 does not take the (111) plane as the preferred orientation, which is different to the general nanotwinned structure (more than 50% of the entire surface takes the (111) plane as the preferred orientation).

As described above, in other embodiments, when the metal substrate 206 is replaced by the insulation substrate, a conductive layer is disposed between the nanotwinned structure 200 and the insulation substrate, and the nanotwinned structure 200 and the conductive layer have a transition layer therebetween.

Third Embodiment

In the embodiment, the nanotwinned structure may be disposed (deposited) in a hole of the substrate in addition to being disposed (deposited) on the top surface of the substrate. For example, the substrate is, for example, a PCB including a dielectric layer and a circuit layer disposed therein, and the hole in the substrate is, for example, a through hole or a blind hole formed in the dielectric layer for forming a conductive device.

Figure 3A:
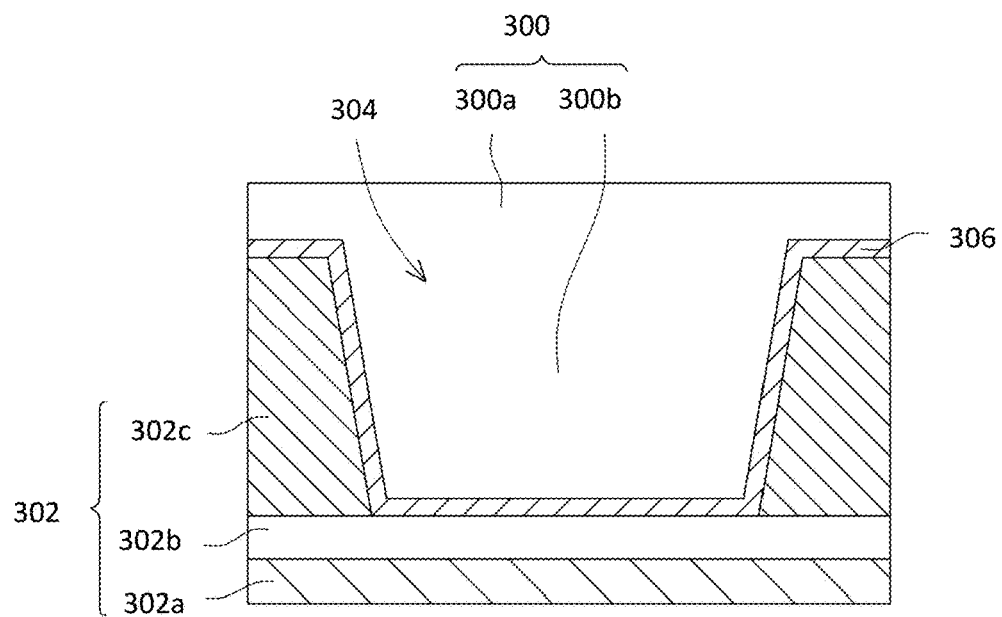
FIG. 3A is a schematic drawing of the cross-sectional view of a blind hole with a nanotwinned structure according to an embodiment of the invention.
Figure 3B:
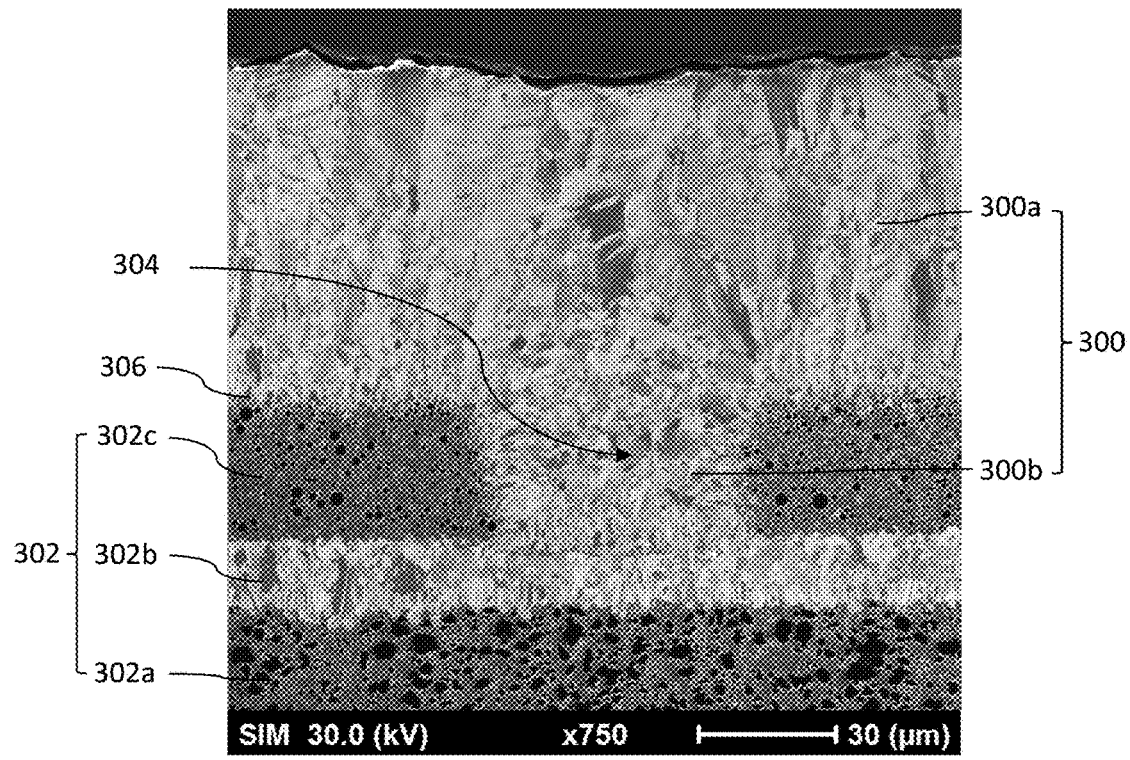
FIG. 3B is a FIB image of the blind-hole (BH) Cu fillings with the nanotwinned structure.

FIG. 3A is a schematic drawing of the cross-sectional view of a blind hole with a nanotwinned structure according to an embodiment of the invention. FIG. 3B is a FIB image of the blind hole with the nanotwinned structure therein.

Referring to FIG. 3A and FIG. 3B, the nanotwinned structure 300 is disposed (deposited) on a top surface of a substrate 302 and in a hole of the substrate 302. In detail, the substrate 302 may include a base 302a, a metal foil 302b (for example, a copper foil) on the base 302a and a dielectric layer 302c on the metal foil 302b, where the dielectric layer 302c has a hole 304 (blind hole) used for forming a conductive device. Moreover, a conductive layer 306 is disposed on the surface of the dielectric layer 302c, a sidewall and a bottom (the metal foil 302b) of the hole 304. The nanotwinned structure 300 has the first portion 300a and the second portion 300b. The nanotwinned structure 300 may have the same structure with the nanotwinned structure 100 or the nanotwinned structure 200. The first portion 300a of the nanotwinned structure 300 may be disposed on the conductive layer 306 on the surface of the dielectric layer 302c as that of the first embodiment, and the second portion 300b of the nanotwinned structure 300 may be disposed on the conductive layer 306 in the hole 304. The conductive layer 306 is, for example, the same with the conductive layer 104. A part of the second portion 300b of the nanotwinned structure 300 located adjacent to the metal foil 302b may be disposed on the metal foil 302b as that of the second embodiment, i.e. the metal foil 302b may directly serve as the conductive layer.

In the embodiment that the hole 304 is a blind hole, the second portion 300b of the nanotwinned structure 300 does not electrically connect the metal foil 302b, so that the lower part of the second portion 300b of the nanotwinned structure 300 is disposed on the conductive layer 306 at the bottom of the blind hole, and the lower part of the second portion 300b and the metal foil 302b have a conductive layer 306 therebetween.

Fourth Embodiment

The nanotwinned structure of the embodiment may be disposed (deposited) on various substrates as that described above. In the embodiment, the nanotwinned structure is deposited on a surface of a substrate. The nanotwinned structure includes a plurality of domains, and each of the domains includes a plurality of nanotwins stacked along the [111] crystallographic axis, and the [111] crystallographic axes of the adjacent domains may be substantially parallel with or not parallel with each other. The shapes of the domains may be polygons, columns, ellipses or a combination thereof. Moreover, less than 50% of the surface of the nanotwinned structure takes the (111) plane as the preferred orientation. A material of the nanotwinned structure may be gold, palladium, silver, platinum, copper, iron, indium, nickel, lead or a combination thereof, and trace elements (such as zinc, tungsten, cobalt, phosphorus, titanium, bismuth, tin, etc.) may be mixed therein.

FIG. 4A is an EBSD-IQ map of a nanotwinned structure according to the fourth embodiment of the invention. FIG. 4B is an IPF of the first domain of FIG. 4A. FIG. 4C is an IPF of the second domain of FIG. 4A.

Referring to FIG. 4A, FIG. 4B and FIG. 4C, the nanotwinned structure 400 of the embodiment is a nanotwinned Cu structure, which is disposed (deposited) on a PCB 402, and a conductive layer 404 is disposed between the nanotwinned structure 400 and the PCB 402. Moreover, a transition layer 406 exists between the nanotwinned structure 400 and the conductive layer 404. The PCB 402, the conductive layer 404, and the transition layer 406 are the same with the PCB 102, the conductive layer 104 and the transition layer 106, respectively, and details thereof are not repeated.

The nanotwinned structure 400 includes a plurality of columnar domains (including the first domain 407 and at least one of the second domain 408). There is a grain boundary 409 between the first domain 407 and the second domain 408. The first domain 407 and the second domain 408 both include a plurality of nanotwinned Cu stacked along the [111] crystallographic axis, i.e. twin planes 410 of the nanotwinned Cu are stacked along the [111] crystallographic axis. The [111] crystallographic axis of the first domain 407 and the [111] crystallographic axis of the second domain 408 may be substantially parallel or not parallel with each other.

Moreover, according to the IPF of the first domain 407 of FIG. 4B and the IPF of the second domain 408 of FIG. 4C, it is known that the entire surface of the first domain 407 does not take the (111) plane as the preferred orientation, and the surface of the second domain 408 takes the (111) plane as the preferred orientation. Statistically, less than 50% of the surface of the nanotwinned structure 400 takes the (111) plane as the preferred orientation, which is different to the general nanotwinned structure (more than 50% of the entire surface takes the (111) plane as the preferred orientation).

In summary, in the nanotwinned structure of the invention, less than 50% of the surface takes the (111) plane as the preferred orientation. When the nanotwinned structure of the invention is applied to metal conductive pillars, wires, an interconnect structure, plating through hole (PTH), through-hole (TH)/blind-hole (BH) fillings, through silicon via (TSV) fillings, through-GaN via (TGNV) fillings, through-glass-via (TGV) fillings, redistribution layer (RDL), heat dissipation devices, etc., of the connecting materials of an electronic package, the components formed by the nanotwinned structure of the invention may have an electromigration resistance characteristic, a high mechanical strength, and a good heat dissipation ability.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:
1. A nanotwinned structure, disposed on a surface of a substrate, comprising:
at least one domain, wherein the domain contains a plurality of nanotwins, and each of the nanotwins possesses the face-centered cubic (FCC) structure, the plurality of nanotwins are stacked along the [111] crystallographic axis, and less than 50% of a surface of the nanotwinned structure takes a (111) plane of the FCC structure as the preferred orientation.

2. The nanotwinned structure as claimed in claim 1, wherein the nanotwinned structure comprises a plurality of the domains, and the [111] crystallographic axes of the adjacent domains are substantially parallel with each other.

3. The nanotwinned structure as claimed in claim 1, wherein the nanotwinned structure includes a plurality of the domains, and the [111] crystallographic axes of the adjacent domains are not parallel with each other.

4. The nanotwinned structure as claimed in claim 1, wherein a material of the nanotwins comprises gold, palladium, silver, platinum, copper, iron, indium, nickel, lead or a combination thereof.

5. The nanotwinned structure as claimed in claim 4, wherein the material of the nanotwins further comprises zinc, tungsten, cobalt, phosphorus, titanium, bismuth, tin or a combination thereof.

6. The nanotwinned structure as claimed in claim 1, wherein a shape of the domain comprises a polygon, a column, an ellipse or a combination thereof.

7. The nanotwinned structure as claimed in claim 1, wherein the nanotwinned structure is disposed on the substrate.

8. The nanotwinned structure as claimed in claim 7, wherein the substrate comprises a conductive substrate.

9. The nanotwinned structure as claimed in claim 8, wherein the conductive substrate comprises a metal substrate or a graphite substrate.

10. The nanotwinned structure as claimed in claim 7, wherein the substrate comprises an insulation substrate, and a conductive layer is disposed between the nanotwinned structure and the insulation substrate.

11. The nanotwinned structure as claimed in claim 10, wherein the insulation substrate comprises a printed circuit board, a silicon substrate, a compound semiconductor substrate, a glass substrate, a quartz substrate, a plastic substrate or a combination thereof.

12. The nanotwinned structure as claimed in claim 10, wherein a material of the conductive layer comprises carbon, gold, palladium, silver, platinum, copper, iron, cobalt, nickel, phosphorus, titanium, tungsten, tin, lead, bismuth, indium, zinc, a combination thereof or indium tin oxide (ITO).

13. The nanotwinned structure as claimed in claim 10, further comprising:
a transition layer between the nanotwinned structure and the conductive layer, wherein the transition layer comprises disperse grains or a combination of the nanotwins and the disperse grains.

14. The nanotwinned structure as claimed in claim 13, wherein a thickness of the transition layer is less than 500 µm.

15. The nanotwinned structure as claimed in claim 1, wherein the nanotwinned structure is disposed in a hole of the substrate, and a conductive layer is disposed between the nanotwinned structure and a sidewall of the hole.

16. The nanotwinned structure as claimed in claim 15, wherein a material of the conductive layer comprises carbon, gold, palladium, silver, platinum, copper, iron, cobalt, nickel, phosphorus, titanium, tungsten, tin, lead, bismuth, indium, zinc, a combination thereof or ITO.

17. The nanotwinned structure as claimed in claim 15, wherein the hole comprises a through hole or a blind hole.

18. The nanotwinned structure as claimed in claim 15, further comprising:
a transition layer, disposed between the nanotwinned structure and the conductive layer, wherein the transition layer comprises disperse grains or a combination of the nanotwins and the disperse grains.

19. The nanotwinned structure as claimed in claim 18, wherein a thickness of the transition layer is less than 500 µm.

* * * * *